(12) United States Patent
Gongwer et al.

(10) Patent No.: US 6,678,192 B2
(45) Date of Patent: Jan. 13, 2004

(54) ERROR MANAGEMENT FOR WRITABLE TRACKING STORAGE UNITS

(75) Inventors: Geoffrey S. Gongwer, Los Altos, CA (US); Shahzad B. Khalid, Union City, CA (US); Daniel C. Guterman, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 151 days.

(21) Appl. No.: 10/053,339

(22) Filed: Nov. 2, 2001

(65) Prior Publication Data

US 2003/0086293 A1 May 8, 2003

(51) Int. Cl.[7] .............................................. G11C 16/06
(52) U.S. Cl. .............................. 365/185.2; 365/185.09; 365/185.24; 365/185.29
(58) Field of Search ....................... 365/189.07, 185.33, 365/185.2, 185.24, 185.08, 185.02, 185.09, 185.01, 185.29

(56) References Cited

U.S. PATENT DOCUMENTS

| | | | |
|---|---|---|---|
| 5,172,338 A | 12/1992 | Mehrotra ..................... 365/185 |
| 5,272,669 A | 12/1993 | Samachisa et al. ......... 365/185 |
| 5,418,752 A | 5/1995 | Harari et al. ................ 365/218 |
| 5,598,370 A | 1/1997 | Niijima et al. ......... 365/185.33 |
| 5,712,179 A | 1/1998 | Yuan ............................ 437/43 |
| 5,717,632 A | 2/1998 | Richart et al. ........... 365/185.2 |
| 5,828,601 A | 10/1998 | Hollmer et al. .......... 365/185.2 |
| 6,103,573 A | 8/2000 | Harari et al. ................ 438/257 |
| 6,222,762 B1 | 4/2001 | Guterman et al. ..... 365/185.03 |
| 6,275,419 B1 | 8/2001 | Guterman et al. ..... 365/185.29 |
| 6,282,145 B1 | 8/2001 | Tran et al. ............. 365/230.06 |
| 6,304,485 B1 | 10/2001 | Harari et al. .......... 365/185.09 |

FOREIGN PATENT DOCUMENTS

WO    WO 02/27729 A2    4/2002

OTHER PUBLICATIONS

U.S. patent application No. 09/671,793, filed Sep. 27, 2000.
U.S. patent application No. 08/910,947, filed Aug. 7, 1997.

Primary Examiner—Richard Elms
Assistant Examiner—Hien Nguyen
(74) Attorney, Agent, or Firm—Beyer Weaver & Thomas, LLP

(57) ABSTRACT

A memory system (e.g., memory card) having error management for stored levels (e.g., reference levels) used in discrimination of logic levels for data storage units providing data storage is disclosed. The stored levels can be stored in predetermined storage units (e.g., writable tracking storage units) in the memory system. The memory system is typically a non-volatile memory product or device that provides binary or multi-state data storage.

46 Claims, 6 Drawing Sheets

ERROR MANAGEMENT FOR WRITABLE TRACKING STORAGE UNITS

CROSS REFERENCE TO RELATED APPLICATIONS

This application is related to (i) U.S. patent application Ser. No. 09/671,793, filed on Sep. 27, 2000, now U.S. Pat. No. 6,538,922 and which is hereby incorporated by reference herein; and (ii) U.S. patent application Ser. No. 08/910,947, filed on Aug. 7, 1997 now U.S. Pat. No. 6,222,762. This application is further related to U.S. Pat. Nos. 5,172,338; 5,712,179; 5,418,752; 6,103,573; 6,222,762; and 6,275,419, each of which is hereby incorporated by reference herein.

BACKGROUND OF THE INVENTION

1. Field of the Invention

The invention relates to a memory system for non-volatile data storage and, more particularly, to a memory system that uses reference levels for reading data stored in a multi-state format.

2. Description of the Related Art

Memory cards are commonly used to store digital data for use with various products (e.g., electronic products). Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

These memory cards are increasingly called on to store greater and greater amounts of data. Consequently, individual storage elements within these memory cards have been developed to support multiple levels so as to effectively store multiple bits of data. Traditional storage elements store only two states, while multiple level or high density storage elements store more than two states (e.g., four states). For example, individual storage elements two states, while multiple level or high density storage elements store more than two states (e.g., four states). For example, individual storage elements in some of today's multiple-level memory cards can store four (4) levels and thus effectively enable a single storage element to act as two (2) bits of data. While these multiple levels allow a memory array to store substantially greater amounts of data without a corresponding increase in size or cost, it is more difficult to read stored data out of the memory array.

Non-volatile memories are very popular and useful because they retain data even after being powered-off. However, the charge retention of non-volatile memories is not perfect. Consequently, after programming a memory cell, the memory cell's voltage can drift up or down depending upon various influences such as applied bias voltages, electromagnetic fields generated in the memory device, and charge trapped in dielectrics of the memory device.

When non-volatile memories support multi-states in each storage element, referred to as a multi-state memory, reference levels are needed to help distinguish between the states when reading data from the memory cells. Conventionally, reference cells have been used within the memory device to store global reference voltages that can be programmed at the factory or written before or with the user cells. However, the ability to retrieve these reference voltages in a precise manner is difficult due to threshold voltage/current distributions among written tracking storage units. The distributions can be due to variation in initial written threshold/current; voltage disturbs; physical variations which result in varied environmental sensitivity; and charge loss from built-in electric or magnetic fields. In any case, the result is an increased probability of error during read operations.

Thus, there is a need for improved approaches to reliably store and acquire reference levels so that states (logic levels) of multi-state memory cells can be reliably retrieved over the life of the memory device.

SUMMARY OF THE INVENTION

Broadly speaking, the invention relates to a memory system (e.g., memory card) having error management for stored levels (e.g., reference levels) used in discrimination of logic levels for data storage units providing data storage. The stored levels can be stored in predetermined storage units (e.g., writable tracking storage units) in the memory system. The memory system is typically a non-volatile memory product or device that provides binary or multi-state data storage.

The invention can be implemented in numerous ways. For example, the invention can be implemented as a system, device or method. Several embodiments of the invention are discussed below.

As a method for determining discrimination levels for states of storage units of a memory product, one embodiment of the invention includes at least the acts of: reading stored levels from a plurality of predetermined storage units; determining whether any of the stored levels are aberrant; correcting for at least one of the stored levels that the determining determines to be aberrant; and determining one or more discrimination levels based on the stored levels.

As a method for managing errors associated with tracking storage units used with data storage units in a memory device, one embodiment of the invention includes at least the acts of: reading reference levels from a plurality of tracking storage units; evaluating a quality for each of the reference levels; determining whether the quality for any of the reference levels is unacceptable; correcting for at least one of the reference levels that the determining determines to be unacceptable; and determining discrimination levels for data storage units associated with the tracking storage units based on the reference levels.

As a method for reading data from a memory device having data storage units and associated tracking storage units, one embodiment of the invention includes at least the acts of: substantially concurrently reading data levels from certain data storage units and reference levels from tracking storage units associated with the certain data storage units; computing a processed reference level from the reference levels; determining state discrimination levels based on the processed reference level; discriminating states of the data levels from the certain data storage units based on the state discrimination levels to acquire read data for a requester; evaluating, substantially concurrently with the discriminating, quality of the reference levels; determining whether the quality of the reference levels is acceptable; directing the read data to the requester when the determining determines that the quality of the reference levels is acceptable; and correcting for at least one of the reference levels when the determining determines that the quality of the reference levels is unacceptable.

As a method for reading data from a memory device having data storage units and associated tracking storage units, another embodiment of the invention includes at least the acts of: substantially concurrently reading data levels from certain data storage units and reference levels from tracking storage units associated with the certain data storage units; computing a processed reference level from the reference levels; determining state discrimination levels based on the processed reference level; discriminating states of the data levels from the certain data storage units based on the state discrimination levels to acquire read data for a requester; evaluating quality of the reference levels; determining whether the quality of the reference levels is acceptable; sending the read data to the requester when the determining determines that the quality of the reference levels is acceptable; halting the sending when the determining determines that the quality of the reference levels is unacceptable; and correcting for at least one of the reference levels when the determining determines that the quality of the reference levels is unacceptable.

As a method for reading data from a memory device having data storage units and associated tracking storage units, another embodiment of the invention includes at least the acts of: substantially concurrently reading data levels from certain data storage units and reference levels from tracking storage units associated with the certain data storage units; computing a processed reference level from the reference levels; determining state discrimination levels based on the processed reference level; discriminating states of the data levels from the certain data storage units based on the state discrimination levels to acquire read data for a requester; evaluating quality of the reference levels; determining whether the quality of the reference levels is acceptable; sending the read data to the requester when said determining determines that the quality of the reference levels is acceptable; canceling the read data that has been received by the requester when said determining determines that the quality of the reference levels is unacceptable; and correcting for at least one of the reference levels when said determining determines that the quality of the reference levels is unacceptable.

As a method for reading data from a memory device having data storage units and associated tracking storage units, another embodiment of the invention includes at least the acts of: initiating a count; reading data levels from certain data storage units and reference levels from tracking storage units associated with the certain data storage units; computing a processed reference level from the reference levels; determining state discrimination levels based on the processed reference level; discriminating states of the data levels from the certain data storage units based on the state discrimination levels to acquire read data for a requester; evaluating quality of the reference levels; determining whether the quality of the reference levels is acceptable; comparing the count with a count limit; correcting for at least one of the reference levels when it is determined that the quality of the reference levels is unacceptable and that the count does not exceed the count limit; updating the count; repeating at least the computing through comparing acts one or more times when it is determined that the quality of the reference levels is unacceptable and that the count does not exceed the count limit; and directing the read data to the requester when it is determined that the quality of the reference levels is acceptable or that the count does exceed the count limit.

As a memory system, one embodiment of the invention includes at least: a plurality of data storage units that provide multi-state data storage in a non-volatile manner, a plurality of tracking storage units that provide storage for reference levels in a non-volatile manner, a reference level error manager that evaluates quality of the reference levels, and a memory controller that controls read, write and erase operations with respect to the data storage units and the tracking storage units. The memory controller uses state discrimination levels to determine the state of the data storage elements being read. The memory system may also include state discrimination level circuitry to determine the state discrimination levels for use by the memory controller based on a plurality of the reference levels.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to a memory system (e.g., memory card) having error management for stored levels (e.g., reference levels) used in discrimination of logic levels for data storage units providing data storage. The stored levels can be stored in predetermined storage units (e.g., writable tracking storage units) in the memory system. The memory system is typically a non-volatile memory product or device that provides binary multi-state data storage.

The memory system can, for example, be associated with a memory card (such as a plug-in card), a memory stick, or some other semiconductor memory product. Examples of memory cards include PC Card (formerly PCMCIA device), Flash Card, Flash Disk, Multimedia Card, and ATA Card.

Embodiments of this aspect of the invention are discussed below with reference to FIGS. 1A through 3. However, those skilled in the art will readily appreciate that the detailed description given herein with respect to these figures is for explanatory purposes as the invention extends beyond these limited embodiments.

Figure 1A:
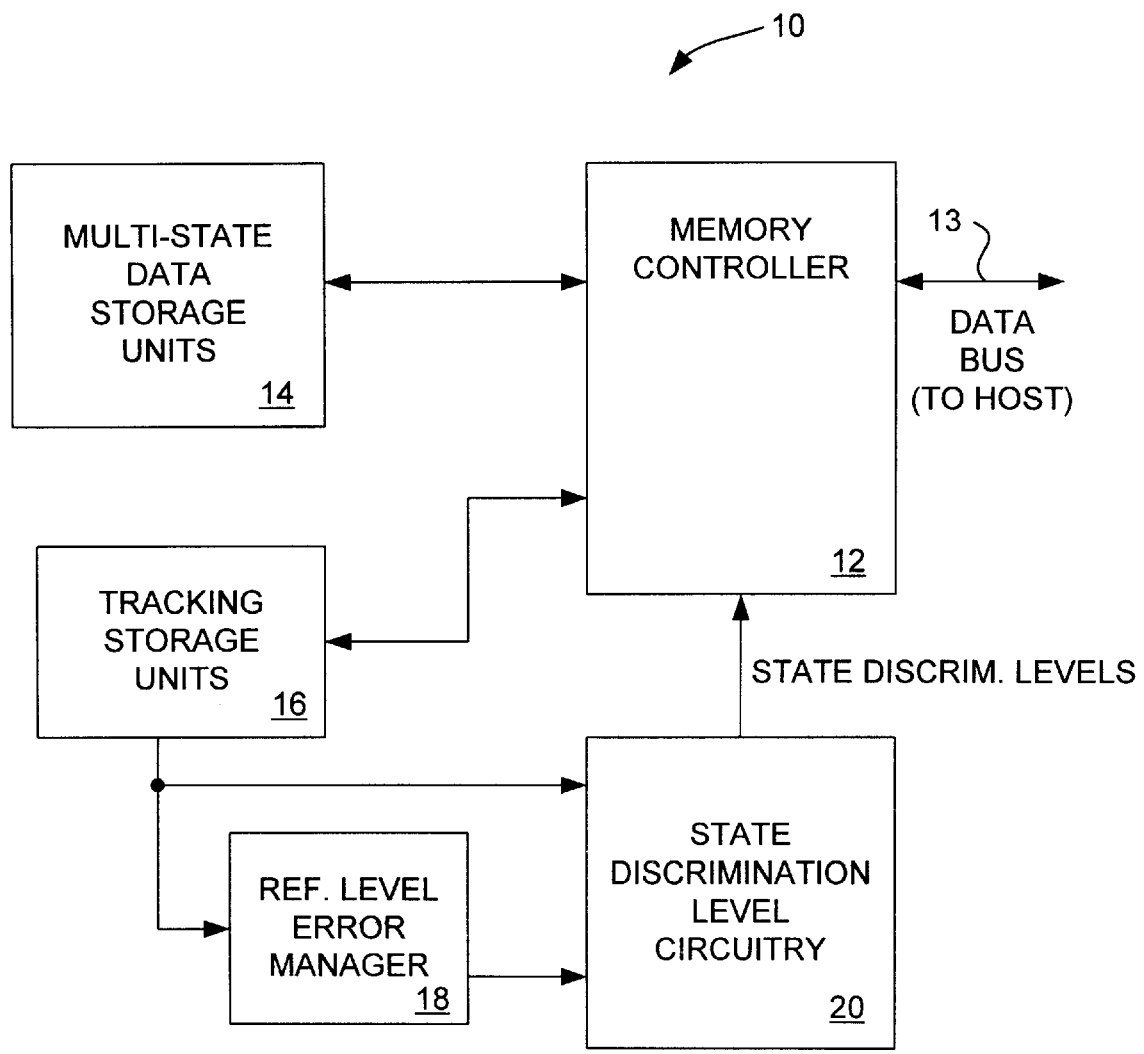
FIG. 1A is a functional block diagram of a memory system according to one embodiment of the invention.

FIG. 1A is a functional block diagram of a memory system 10 according to one embodiment of the invention. The memory system 10 provides high density data storage using multi-state storage. The memory system 10 includes a memory controller 12 that controls operations (e.g., read, erase, program) for the memory system 10 and communicates with a host over a data bus 13. The memory system 10 also includes multi-state data storage units 14 (e.g., memory cells) that store data for the memory system 10 in a non-volatile fashion. The multi-state data storage units 14 provide high density storage for data because each data storage unit (data storage element) is capable of storing more than two states. In other words, each data storage unit (e.g., memory cell) is capable of storing more than one bit of data. The multi-state data storage units 14 are typically arranged in blocks, which represent the smallest write unit in one embodiment.

The memory system 10 also includes tracking storage units 16 that store reference levels in a non-volatile fashion, a reference level error manager 18, and a state discrimination level circuitry 20. The tracking storage units 16 are associated with the multi-state data storage units 14. More particularly, a plurality of the tracking storage units 16 are provided for and associated with each block of memory in the multi-state data storage units 14. The tracking storage units 16 associated with a block of data being written are re-programmed with reference levels each time the multi-state data storage units 14 associated with the block are written. Typically, the tracking storage units 16 are programmed with fixed, global reference levels at the same time that the multi-state data storage units 14 are re-programmed with the reference levels. The stored reference levels in the tracking storage units 16 are used to set threshold levels (e.g., voltage thresholds) used in state (logic level) discrimination by both the data storage units 14 and the tracking storage units 16. The reference levels stored to the tracking storage units 16 are read every time the data storage units 14 are read, and these reference levels (e.g., threshold voltages) are utilized to determine the stored logic levels of the data storage units 14.

It is known that non-volatile memory cells have charge retention characteristics that change as a function of the number of program/erase cycles performed. By re-programming the tracking storage units 16 each time the associated data storage units 14 are programmed, the tracking storage units 16 develop the same history, and therefore the same charge retention characteristics as the associated data storage units 14. In other words, by having the tracking storage units 16 erased and re-programmed the same number of times as the corresponding data storage units 14, the cycling dependence on charge retention is accounted for, allowing the effective threshold margin for discriminating the logic levels stored in the data storage units 14 to be maintained. Consequently, degradation of effective threshold margin of the data storage units 14 due to charge loss is reduced. Accordingly, determination of the stored logic levels for the data storage units 14 can be reliably performed over the life of the memory device.

According to one embodiment of the invention, a plurality of the tracking storage units 16 are written to predetermined states each time the associated data storage units 14 are written. When the associated data storage units 14 are to be read, the reference levels are read from the plurality of the tracking storage units 16 associated therewith and used by the state discrimination level circuitry 20 to determine discrimination points (state discrimination levels). Once the discrimination points are determined, the memory controller 12 (or the data storage units themselves) can determine the stored logic levels within the data storage units 14. As the discrimination points are being determined or as the logic levels stored in the data storage units 14 are being determined using the discrimination points, the quality of the reference levels (voltage or current) can be examined by the reference level error manager 18. Any of the reference levels from the tracking storage units 14 that are determined to have a reference level with an unacceptable quality can be corrected (e.g., discarded or replaced). Thereafter, new discrimination points are determined by the state discrimination level circuitry 20 utilizing the reference levels from the tracking storage units 14 with acceptable quality. The new discrimination points are then used to extract the storage logic levels from the data storage units 16.

Although the reference level error manager 18 and the state discrimination level circuitry 20 are shown as separate components, the circuitry for these components can be combined together or can be combined into the memory controller 12. In general, the memory system 10 provides high density, non-volatile data storage and can be configured in a variety of ways. For example, the memory system 10 can be formed as a memory card (such as a plug-in card), a memory stick, or some other semiconductor memory product.

Figure 1B:
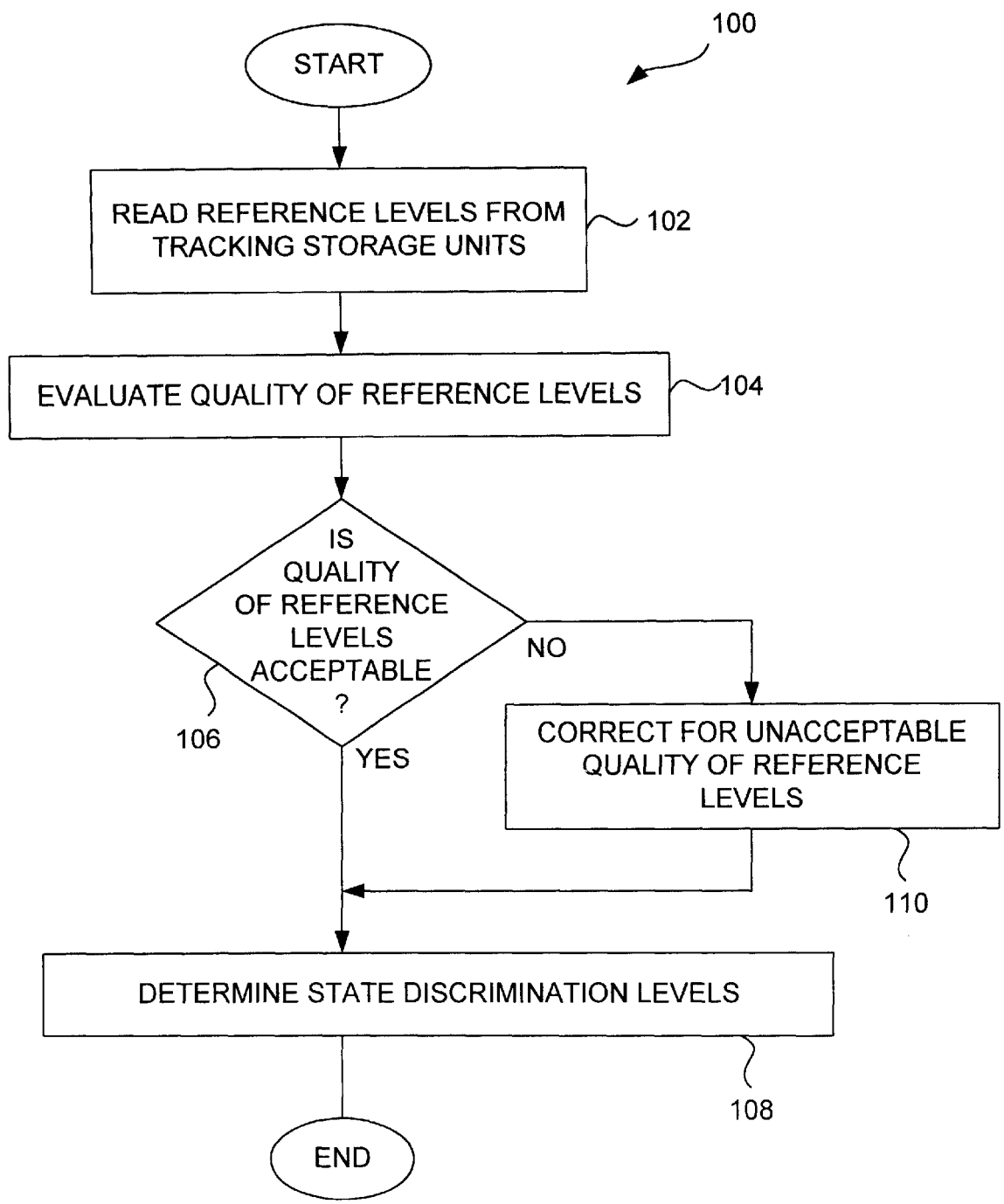
FIG. 1B is a flow diagram of discrimination level processing according to one embodiment of the invention.

FIG. 1B is a flow diagram of discrimination level processing 100 according to one embodiment of the invention. The discrimination level processing 100 is, for example, performed by a memory system providing multi-state storage (e.g., memory system 10). With multi-state storage, higher density storage capacity is available for data because each data storage unit (data storage element) is capable of storing more than two states. In other words, each data storage unit (e.g., memory cell) is capable of storing more than one bit of data. Hence, the data storage units can also be referred to as multi-state data storage units.

The discrimination level processing 100 initially reads (102) reference levels from tracking storage units. The tracking storage units are provided in the memory system to provide reference levels which are used in determining discrimination levels that are, in turn, used to discriminate between the various states supported by the multi-state storage. After the reference levels are read (102) from the tracking storage units, the quality of the reference levels is evaluated (104). Here, the quality of the reference levels is a measurement of how reliable the reference levels are since these reference levels can degrade or be corrupted by a variety of influences.

Next, a decision (106) is made to determine whether the quality of the reference levels is acceptable. When the decision (106) determines that the quality of the reference levels is not acceptable, then the discrimination level processing 100 operates to correct (110) for the reference levels having unacceptable quality. In one embodiment, the correction (110) can operate to alter or eliminate one or more of the reference levels having an unacceptable quality.

On the other hand, when the decision (106) determines that the quality of the reference levels is acceptable (or following correction (110) to reference levels with unacceptable quality), then the reference levels are able to be utilized by the memory system in its operation. Namely, after the decision (106) determines that the quality of the reference levels is acceptable (or after correction (110) when the quality of the reference levels was unacceptable), state discrimination levels are determined (108). Here, the reference levels obtained from the tracking storage units are used to determine the state discrimination levels. These state discrimination levels are then utilized by the memory system to distinguish between the different states that can be stored to the multi-state data storage units. Each data storage unit (e.g., memory cell) of the memory system can store a charge amount that corresponds to one of more than two states. For example, the multi-state data storage units might support 16 states or levels of storage in a single data storage unit, which is equivalent to 4 bits of data. Hence, the state discrimination levels can provide current or voltage levels that allow the memory system or other circuitry to determine the particular state in which a given data storage unit resides. Following the operation (108), the discrimination level processing 100 is complete and ends.

Figure 2A:
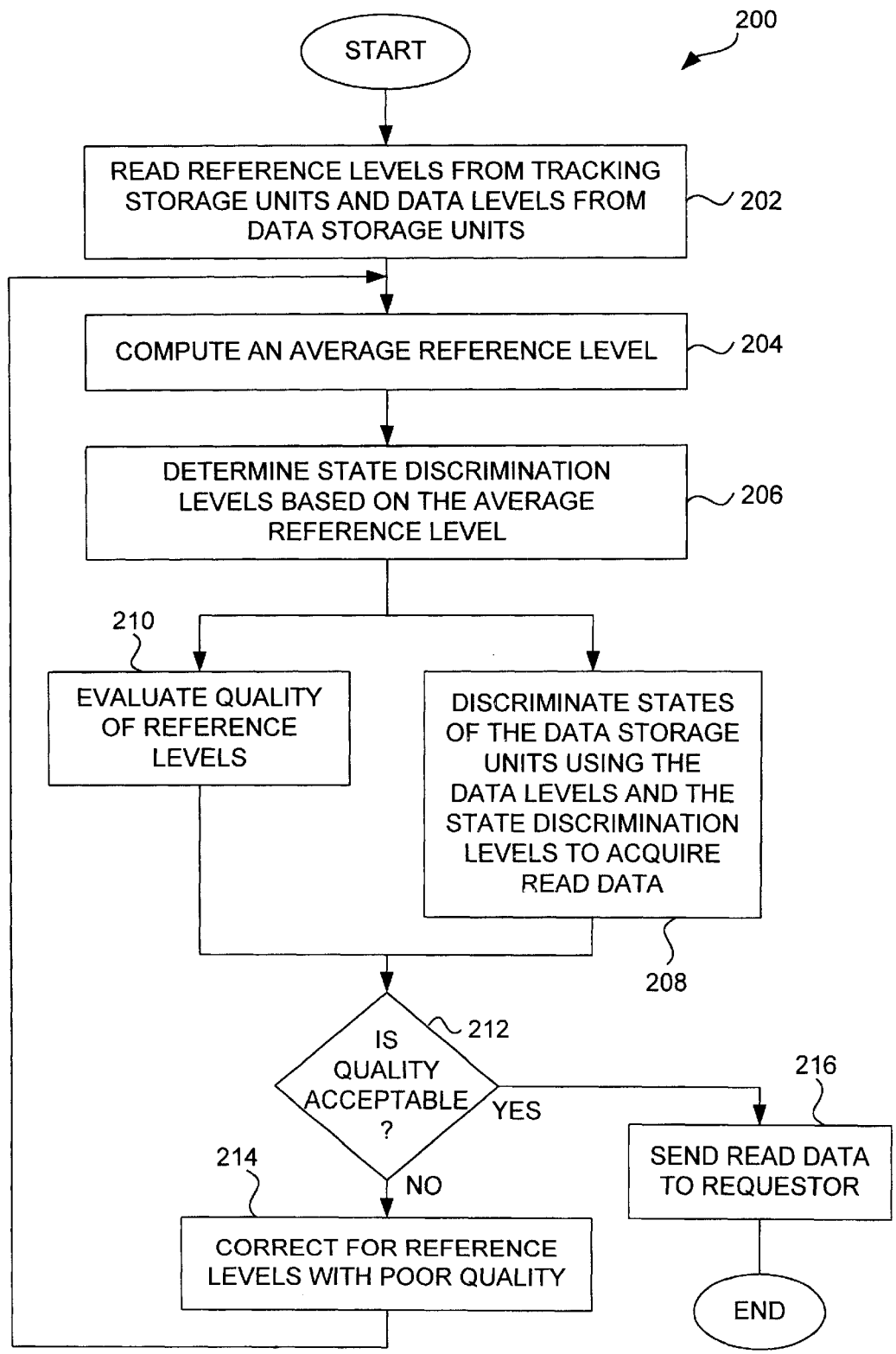
FIG. 2A is a flow diagram of read request processing according to one embodiment of the invention.

FIG. 2A is a flow diagram of read request processing 200 according to one embodiment of the invention. The read request processing 200 is, for example, performed by a memory system having multi-state data storage units when a requester (e.g., host) has requested to read data from storage locations within the memory system.

The read request processing 200 initially reads (202) reference levels from tracking storage units as well as data levels from data storage units. Here, the reference levels are read from the tracking storage units that are associated with the data storage units that hold the data levels that are being read. In addition, the reference levels are read at substantially the same time as the data levels are read. The reference levels can pertain to one or more levels. In one embodiment, a plurality of tracking storage units store the same reference level for improved reliability. In one implementation, for example, two or more (e.g., 16) tracking storage units are used to store the same reference level. The tracking storage units are written, erased and read when their associated data storage units are written, erased or read and thus "track" the use of the associated data storage units. As a result, the tracking storage units develop the same history and therefore the same charge retention characteristics as the data storage units. In addition, the tracking storage units experience the same operational conditions such as voltage and temperature which can affect state sensing. Consequently, discrimination of the data levels stored in the data storage units is made more reliable.

Next, an average reference level is computed (204). Here, the reference levels that are read (202) can be averaged to produce the average reference level. After the average reference level is computed (204), state discrimination levels are determined (206) based on the average reference level. As noted above, the state discrimination levels are utilized by the memory system to distinguish between the various states supported by the multi-state data storage units.

Once the state discrimination levels have been determined (206), states of the data storage units can be discriminated (208) using the data levels from the data storage units and the state discrimination levels from the tracking storage units to acquire read data. Here, the previously read data levels (operation 202) can be examined to determine the state for the data storage units by use of the state discrimination levels. The discrimination (208) of the states, in effect, allows the memory system to acquire the read data that is to be read by the read request processing 200. Substantially concurrent with the discrimination (208), the read request processing 200 also evaluates (210) a quality of the reference levels. In one embodiment, the evaluation of the quality of the reference levels is typically individually performed on each of the reference levels. However, in other embodiments, the quality of the reference levels could instead be performed on two or more of the reference levels as a group.

Following the operations 208 and 210, a decision (212) determines whether the quality of the reference levels is acceptable. When the decision (212) determines that the quality is not acceptable, then the read request processing 200 operates to correct (214) for the reference levels with the poor quality. Here, the correction (214) can operate to eliminate, replace or alter in some other way one or more of the reference levels having a poor quality. Following the operation 214, the read request processing 200 returns to repeat the operation 204 and subsequent operations so that the state discrimination levels can be re-determined and utilized based upon the reference levels following the correction (214). Alternatively, when the decision (212) determines that the quality is acceptable, then the read data can be sent (216) to the requester for the read operation. Typically, the requester is a host device that utilizes the memory system. Following the operation 216, the read request processing 200 is complete and ends.

By performing the evaluation (210) and the discrimination (208) substantially concurrently, the evaluation (210) of the quality of the reference levels is able to be performed without a performance penalty to the read request processing 200 whenever the initially read tracking cell quality is deemed acceptable. With an optimally designed and manufactured memory system, the reference levels will, in most cases, have an acceptable quality as initially read. Thus the evaluation (210) of the quality of the reference levels will not have a significant impact on the performance (namely, read performance) of the memory system. In a rare instance when one or more of the reference levels has an unacceptable quality, a performance impact will be imposed because the reference levels must be corrected (214) and then operations 204–208 must be performed again. However, because of its rarity, the performance impact is minimized.

Figure 2B:
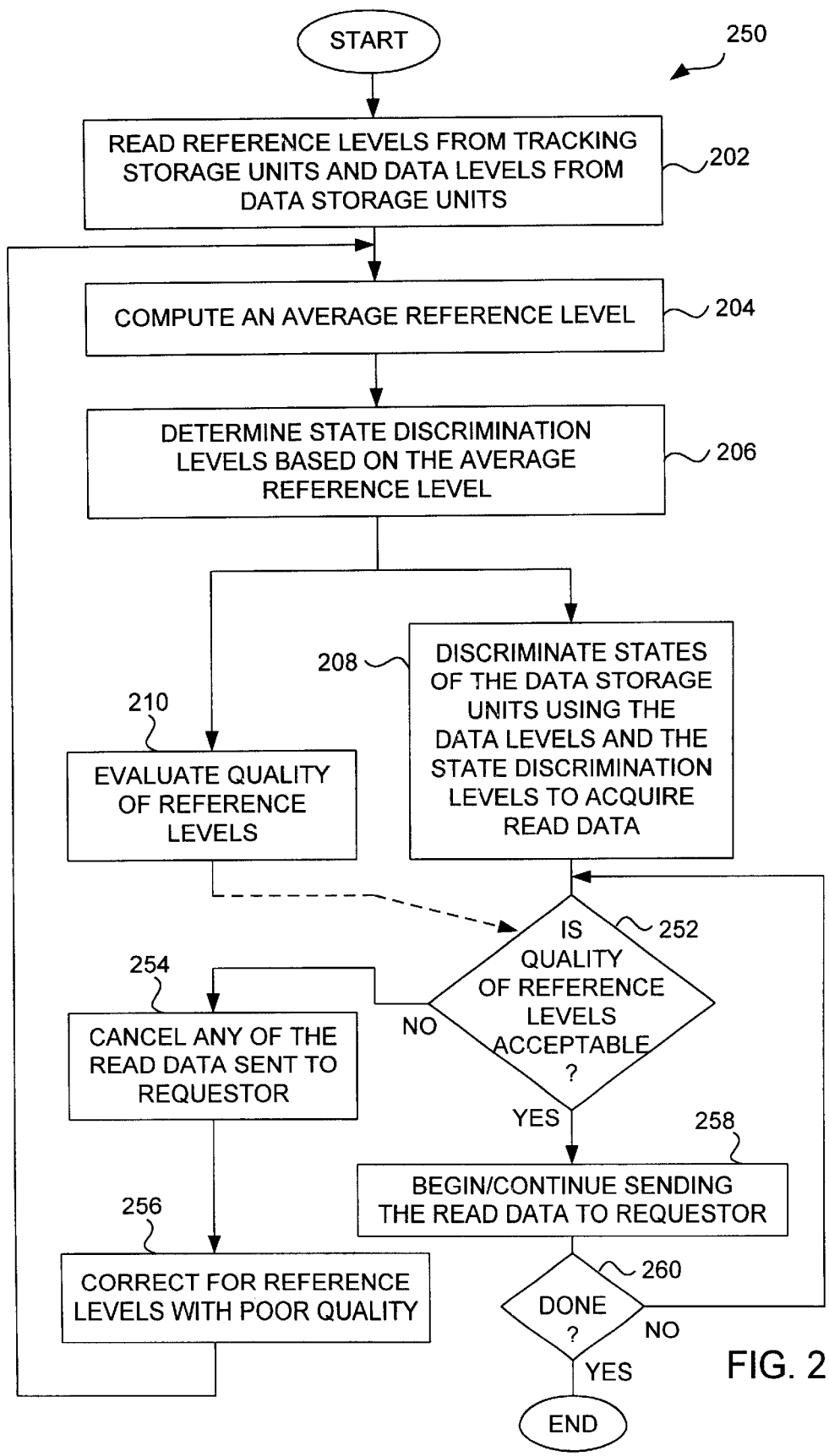
FIG. 2B is a flow diagram of read request processing according to another embodiment of the invention.

FIG. 2B is a flow diagram of read request processing 250 according to another embodiment of the invention. The read request processing 250 is generally similar to the read request processing 200 illustrated in FIG. 2A with respect to various operations, namely, operations 202–210. However, the read request processing 250 pertains to another embodiment in which the discrimination (208) completes before the evaluation (210) completes. Hence, in this embodiment, the read data can begin being sent to the requester while the evaluation (210) remains ongoing. Here, if needed, the evaluation (210) can also be performed concurrently with at least a portion of the sending of the read data to the requester. More particularly, following the discrimination (208) of the states of the data storage units, a decision (252) determines whether the quality of reference levels is acceptable. When the decision (252) determines that the quality of the reference levels is not acceptable, then any of the read data that has been already sent to the requester is cancelled (254). Here, since the evaluation (210) may not be completed when the discrimination (208) is completed, the read data can begin its transmission to the requester. If it turns out that the quality of the reference levels utilized in determining the discrimination (208) states was unacceptable, then the read data that has been sent in this regard is cancelled (254). Next, the read request processing 250 corrects (256) for the reference levels with poor quality. Again, the correction (256) can pertain to adjusting or eliminating one or more of the reference levels having the poor quality. Following the operation 256, the read request processing 250 returns to repeat the decision (204) and subsequent operations so that the reference levels, as corrected, can be utilized in re-determining the state discrimination levels and thus the read data from the multi-state data storage units.

On the other hand, when the decision (252) determines that the quality of the reference levels is acceptable (which it is initially presumed to be), the read data can begin to be sent (258) to the requester. At this point, the states of the multi-state data storage units have been established at operation 208 and thus the sending of the read data can proceed. In general, the decision (252) is performed asynchronously with the sending (258) of the data. Following the operation 258, a decision (260) determines whether the sending of the read data is completed. When the decision (260) determines that the read data has not been completely sent to the requester, then the read request processing 250 returns to repeat the decision (252) and subsequent operations so that the sending (258) of the read data can continue until either cancelled at operation 254 (due to unacceptable quality of the reference levels) or completed at the decision (260). Once the sending of the read data has been completed (without being cancelled), the read request processing 250 is complete and ends as the read request has been fully processed.

Figure 2C:
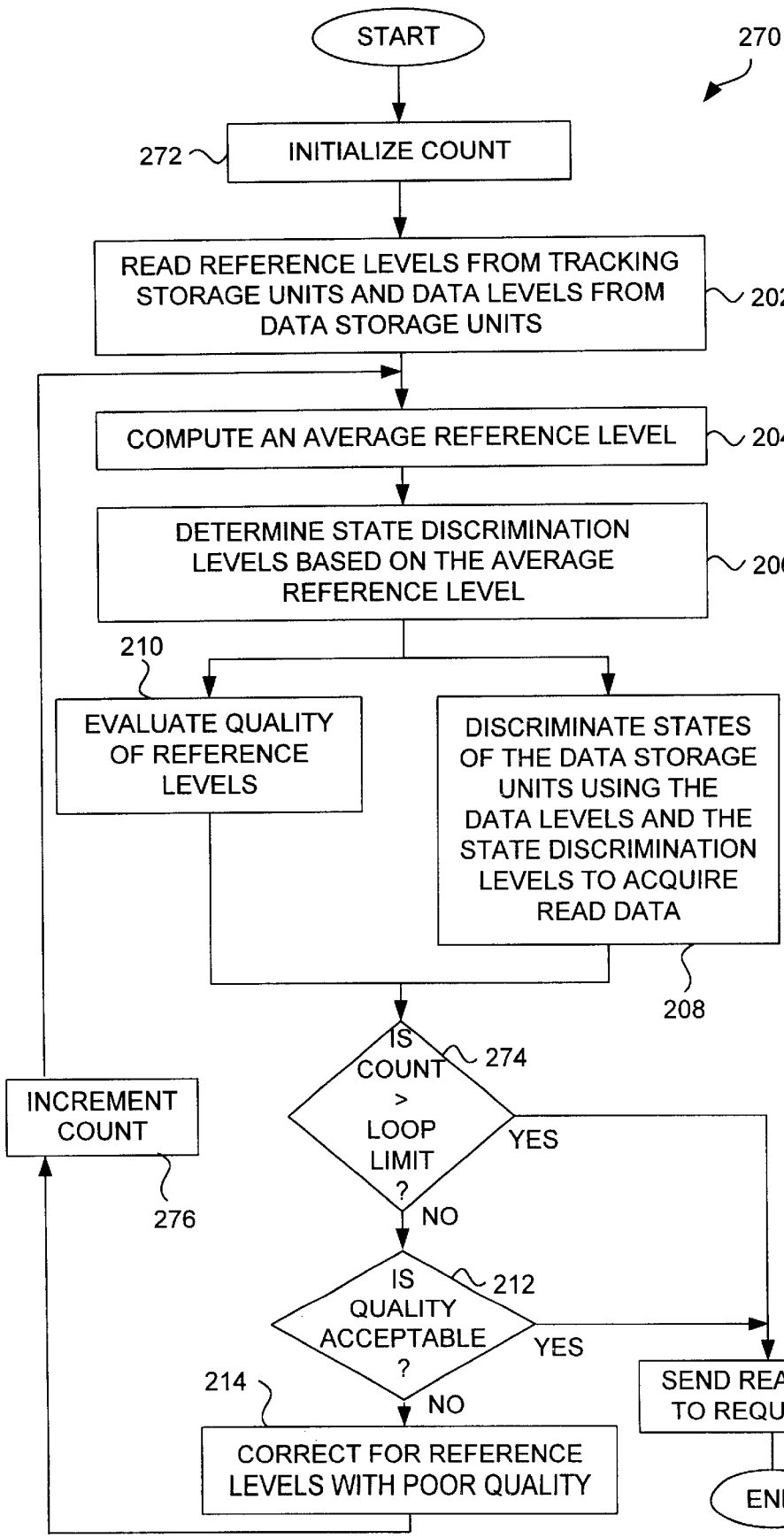
FIG. 2C is a flow diagram of read request processing 270 according to still another embodiment of the invention.

FIG. 2C is a flow diagram of read request processing 270 according to still another embodiment of the invention. The read request processing 270 is generally similar to the read request processing 200 illustrated in FIG. 2A with respect to various operations, namely, operations 202–216. However, the read request processing 270 further includes a loop control feature. The loop control feature controls the number of times operations 204–214 can be repeated. In other words, for performance reasons, it is desirable to limit the amount of time that can be spent in attempting to achieve sufficient quality. According to the read request processing 270, upon starting the processing, a count is initialized 272 to a predetermined value (e.g., "0"). Then, following operations 208 and 210, a decision (274) determines whether a count (i.e., loop count) is greater than a loop limit (e.g., "1"). When the count is not greater than the loop limit, then operation 212 can be performed. When the decision (212) determines that the quality is not acceptable, then operation 214 can be performed. Following operation 214, before returning to loop back to operation 204, the count is incremented (276). Accordingly, the loop limit can cause the read request processing 270 to send (216) the read data to the requester (or otherwise quit the read request processing 270) even if the quality is not yet deemed acceptable. The loop control feature can also be used with the read request processing 250 of FIG. 2B.

Still further, although the read request processing 200, 250 and 270 illustrated in FIGS. 2A, 2B and 2C indicate the computation of an average reference level at operation 204, such computation is not restricted to averaging. More generally, the reference levels can be mathematically processed (e.g., statistically processed) in any of a number of ways, such as through computation of a minimum, maximum, Root-Mean-Square (RMS), peak, average, median, modulus, and/or linear regression. Regardless of the mathematical processing performed on the reference levels, the state discrimination levels are thereafter determined based on the processed reference level. As noted above, the state discrimination levels are utilized by the memory system to distinguish between the various states supported by the multi-state data storage units.

The read request processing 200, 250 and 270 illustrated in FIGS. 2A, 2B and 2C respectively, generally refer to the use of a single reference level obtained from a plurality of reference levels that, in effect, store the same level. However, it should be understood that the read request processing may utilize two or more reference levels to determine a plurality of the state discrimination levels utilized by the multi-state memory. In this regard, for each of the reference levels established, a plurality of tracking storage units that store the same reference level are used. For example, when reading the reference levels from the tracking storage units, a first plurality of the tracking storing units would correspond to a first reference level and a second plurality of tracking storage units would pertain to a second reference level, and so on, if more average reference levels than two are utilized. The determination of the state discrimination levels can then utilize the one or more reference levels. Alternatively, the entire population of tracking storage units set to span the range of reference levels can be statistically processed as an ensemble, for example, using linear regression methodology.

According to another aspect of the invention, a memory system can also use Error Correction Codes (ECC) when reading data. ECC is well known and often used to enable reading data with increased reliability. ECC is used to minimize how often the quality evaluation and/or correction of reference levels needs to be performed. Since the quality evaluation and/or correction processing requires computational resources and time, minimizing their utilization lessens performance degradation caused by said processing.

Figure 3:
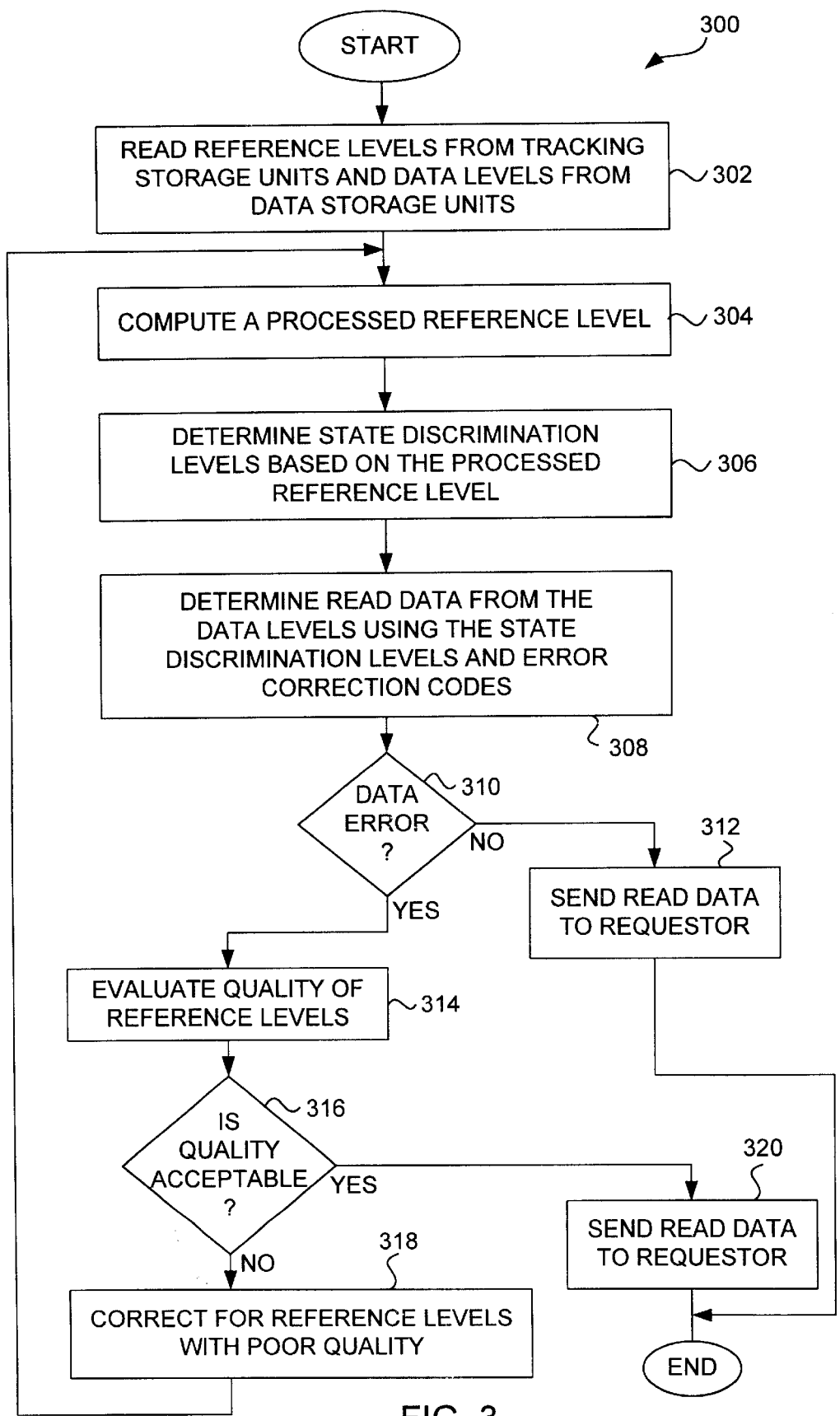
FIG. 3 is a flow diagram of read request processing according to another embodiment of the invention.

FIG. 3 is a flow diagram of read request processing 300 according to another embodiment of the invention. The read request processing 300 is, for example, performed by a memory system having multi-state data storage units when a requester (e.g., host) has requested to read data from storage locations within the memory system.

The read request processing 300 initially reads (202) reference levels from tracking storage units as well as data levels from data storage units. Here, the reference levels are read from the tracking storage units that are associated with the data storage units that hold the data levels that are being read. In addition, the reference levels are read at substantially the same time as the data levels are read. The reference levels can pertain to one or more levels. In one embodiment, a plurality of tracking storage units store the same reference level for improved reliability. The tracking storage units are written, erased and read when their associated data storage units are written, erased or read and thus "track" the use of the associated data storage units. As a result, the tracking storage units develop the same history and therefore the same charge retention characteristics as the data storage units. In addition, the tracking storage units experience the same operational conditions, such as voltage and temperature, which can affect state sensing. Consequently, reliability of discrimination of the data levels stored in the data storage units is increased.

Next, a processed reference level is computed (304). Here, the reference levels that are read (302) are processed to produce the processed reference level. The computation (304) to the reference levels in producing the processed reference level can be achieved in any of a number of ways, such as, through computation of a minimum, maximum, Root-Mean-Square (RMS), peak, average, median, modulus, and/or linear regression. After the processed reference level is computed (304), state discrimination levels are determined (306) based on the processed reference level. As noted above, the state discrimination levels are utilized by the memory system to distinguish between the various states supported by the multi-state data storage units.

Once the state discrimination levels have been determined (306), the read data can be determined (308) from the data levels using the state discrimination levels and error correction codes. Here, the previously read data levels (operation 302) are examined to determine the state for the data storage units by use of the state discrimination levels. Additionally, ECC that is also provided by the memory system is used to more reliability determine (308) the read data.

Next, using the ECC, a decision (310) determines whether a data error is identified in determining (308) the read data. Typically, when the ECC is not able to reliably establish the read data, the ECC indicates that a data error exists. When the decision (310) determines that there is not a data error, then the read data is sent (312) to the requester. On the other hand, when the decision (310) determines that a data error exists, then quality evaluation and/or correction to the reference levels can be performed in an effort to overcome the data error. More particularly, when the decision (310) determines that a data error exists, the quality of the reference levels is evaluated (314). In one embodiment, the evaluation of the quality of the reference levels is typically individually performed on each of the reference levels. However, in other embodiments, the quality of the reference levels could instead be performed on two or more of the reference levels as a group. A decision (316) then determines whether the quality of the reference levels is acceptable. When the decision (316) determines that the quality is not acceptable, then the read request processing 300 operates to correct (318) the reference levels with poor quality. Here, the correction (318) can operate to alter or eliminate one or more of the reference levels having a poor quality. Following the operation 318, the read request processing 300 returns to repeat the operation 304 and subsequent operations so that the state discrimination levels can be re-determined and utilized to re-determine the read data based upon the reference levels following the correction (318). Alternatively, when the decision (316) determines that the quality is acceptable, then the read data is erroneous and thus a data read error is sent (320) to the requester. Typically, the requester is a host device that utilizes the memory system. Following the operations 312 or 320, the read request processing 300 is complete and ends. The loop control feature shown in FIG. 2C can also be used with the read request processing 300.

It should be noted that in this embodiment the operations 314–318 of the read request processing 300 are only performed when the ECC signals a failure in reading the data. As a result, with an optimally designed system, the operations 314–318 are only performed in rare circumstances. It is then only in rare circumstance that the read processing performance is slowed or degraded due to performance of quality evaluation and/or correction processing of operations 314–318.

Although much of the discussion of the invention provided above pertains to multi-state devices, it should be understood that the invention is also applicable to binary storage devices. Multi-state devices do, however, provide greater storage density than binary storage devices.

The invention can further pertain to an electronic system that includes a memory system as discussed above. Memory systems (i.e., memory cards) are commonly used to store digital data for use with various electronic products. Often, the memory system is removable from the electronic system so that the stored digital data is portable. The memory systems according to the invention can have a relatively small form factor and be used to store digital data for electronic products such as cameras, hand-held or notebook computers, network cards, network appliances, set-top boxes, hand-held or other small audio players/recorders (e.g., MP3 devices), and medical monitors.

The advantages of the invention are numerous. Different embodiments or implementations may yield one or more of the following advantages. One advantage of the invention is that error management for reference levels is provided. Another advantage of the invention is that error management for reference levels can be performed without significant performance penalty. Still another advantage of the invention is that reliable, high performance memory systems can be obtained.

The many features and advantages of the present invention are apparent from the written description and, thus, it is intended by the appended claims to cover all such features and advantages of the invention. Further, since numerous modifications and changes will readily occur to those skilled in the art, the invention should not be deemed limited to the exact construction and operation as illustrated and described. Hence, all suitable modifications and equivalents are included within the scope of the invention.

What is claimed is:

1. A method for determining discrimination levels for states of storage units of a memory product, said method comprising:
   reading stored levels from a plurality of predetermined storage units;
   determining whether any of the stored levels are aberrant;
   correcting for at least one of the stored levels that said determining determines to be aberrant; and
   determining one or more discrimination levels based on the stored levels following said correcting.

2. A method as recited in claim 1, wherein said correcting comprises discarding the at least one of the stored levels that said determining determines to be aberrant.

3. A method as recited in claim 1, wherein said determining of whether any of the stored levels are aberrant comprises:
   determining a processed stored level from at least a plurality of the stored levels; and
   comparing each of the stored levels to the processed stored level.

4. A method as recited in claim 3, wherein said correcting comprises discarding those of the stored levels that deviate from the processed stored level by more than a predetermined amount.

5. A method as recited in claim 1, wherein said determining of whether any of the stored levels are aberrant comprises:
   obtaining an average stored level from the stored levels; and
   comparing each of the stored levels to the average stored level.

6. A method as recited in claim 1, wherein the stored levels are reference levels.

7. A method as recited in claim 1, wherein the predetermined storage units are tracking storage units.

8. A method as recited in claim 1, wherein said method further comprises:
   thereafter determining states of certain of the data stored in the storage units of the memory product in accordance with the discrimination levels.

9. A method as recited in claim 1, wherein the memory product is a memory card providing non-volatile data storage.

10. In a memory device, a method for managing errors associated with tracking storage units used with data storage units, said method comprising:
    reading reference levels from a plurality of tracking storage units;
    evaluating a quality for each of the reference levels;
    determining whether the quality for any of the reference levels is unacceptable;
    correcting for at least one of the reference levels that said determining determines to be unacceptable; and
    determining, following said correcting, discrimination levels for data storage units associated with the tracking storage units based on the reference levels.

11. A method as recited in claim 10, wherein said method further comprises:
   subsequently using the discrimination levels to determine states of data stored in the data storage units.

12. A method as recited in claim 10, wherein said determining of whether the quality for any of the reference levels is unacceptable comprises:
   determining a processed reference level from at least a plurality of the reference levels; and
   comparing each of the reference levels to the processed reference level.

13. A method as recited in claim 12, wherein said correcting for at least one of the reference levels that said determining determines to be unacceptable comprises:
   removing those of the reference levels that deviate from the processed reference level by more than a predetermined amount.

14. A method as recited in claim 10, wherein the memory device is a memory card providing non-volatile, multi-state data storage.

15. A method for reading data from a memory device having data storage units and associated tracking storage units, said method comprising:
   (a) substantially concurrently reading data levels from certain data storage units and reference levels from tracking storage units associated with the certain data storage units;
   (b) computing a processed reference level from the reference levels;
   (c) determining state discrimination levels based on the processed reference level;
   (d) discriminating states of the data levels from the certain data storage units based on the state discrimination levels to acquire read data for a requester;
   (e) evaluating, substantially concurrently with said discriminating (d), quality of the reference levels;
   (f) determining whether the quality of the reference levels is acceptable;
   (g) directing the read data to the requester when said determining (f) determines that the quality of the reference levels is acceptable; and
   (h) correcting for at least one of the reference levels when said determining (f) determines that the quality of the reference levels is unacceptable.

16. A method as recited in claim 15, wherein said method further comprises:
   (i) following said correcting (h), repeating at least said computing (b) through said discriminating (d) one or more times when said determining (f) determines that the quality of the reference levels is unacceptable.

17. A method as recited in claim 15, wherein said determining (f) of whether the quality of the reference levels is acceptable comprises:
   comparing each of the reference levels to the processed reference level.

18. A method as recited in claim 15,
   wherein the reference levels being read by said reading (a) pertain to first and second reference levels,
   wherein said computing (b) computes a first processed reference level from the reference levels pertaining to the first reference level, and computes a second processed reference level from the reference levels pertaining to the second reference level, and
   wherein said determining (c) determines the state discrimination levels based on the first and second processed reference levels.

19. A method as recited in claim 18, wherein said determining (f) of whether the quality of the reference levels is acceptable comprises:
   comparing each of the reference levels pertaining to the first reference level to the first processed reference level, and
   comparing each of the reference levels pertaining to the second reference level to the second processed reference level.

20. A method as recited in claim 15, wherein the memory device is a memory card providing non-volatile, multi-state data storage.

21. A method as recited in claim 15, wherein said computing (b) operates to average the reference levels to compute the processed reference level.

22. A method as recited in claim 15, wherein said computing (b) performs at least one of a minimum, maximum, Root-Mean-Square (RMS), peak, average, median, modulus, and linear regression with respect to the reference signals in computing the processed reference level.

23. A method as recited in claim 15, wherein said computing (b) computes a plurality of processed reference levels from the reference levels, and
   wherein said determining (c) operates to determine the state discrimination levels based on the processed reference levels.

24. A method for reading data from a memory device having data storage units and associated tracking storage units, said method comprising:
   (a) substantially concurrently reading data levels from certain data storage units and reference levels from tracking storage units associated with the certain data storage units;
   (b) computing a processed reference level from the reference levels;
   (c) determining state discrimination levels based on the processed reference level;
   (d) discriminating states of the data levels from the certain data storage units based on the state discrimination levels to acquire read data for a requester;
   (e) evaluating quality of the reference levels;
   (f) determining whether the quality of the reference levels is acceptable;
   (g) sending the read data to the requester when said determining (f) determines that the quality of the reference levels is acceptable;
   (h) halting said sending (g) when said determining (f) determines that the quality of the reference levels is unacceptable; and
   (i) correcting for at least one of the reference levels when said determining (f) determines that the quality of the reference levels is unacceptable.

25. A method as recited in claim 24, wherein said method further comprises:
   (j) following said correcting (i), repeating said computing (b) through said correcting (i) one or more times when said determining (f) determines that the quality of the reference levels is unacceptable.

26. A method as recited in claim 25, wherein said halting (h) comprises canceling any read data that has been received by the requester prior to said halting (h).

27. A method as recited in claim 24, wherein said halting (h) comprises canceling any read data that has been received by the requestor prior to said halting (h).

28. A method as recited in claim 24, wherein said determining (f) of whether the quality of the reference levels is acceptable comprises:

comparing each of the reference levels to the processed reference level.

29. A method as recited in claim 24,
wherein the reference levels being read by said reading (a) pertain to first and second reference levels,
wherein said computing (b) computes a first processed reference level from the reference levels pertaining to the first reference level, and computes a second processed reference level from the reference levels pertaining to the second reference level, and
wherein said determining (c) determines the state discrimination levels based on the first and second processed reference levels.

30. A method as recited in claim 29, wherein said determining (f) of whether the quality of the reference levels is acceptable comprises:
comparing each of the reference levels pertaining to the first reference level to the first processed reference level, and
comparing each of the reference levels pertaining to the second reference level to the second processed reference level.

31. A method as recited in claim 24, wherein the memory device is a memory card providing non-volatile, multi-state data storage.

32. A method as recited in claim 24, wherein said computing (b) operates to average the reference levels to compute the processed reference level.

33. A method as recited in claim 24, wherein said computing (b) performs at least one of a minimum, maximum, Root-Mean-Square (RMS), peak, average, median, and modulus with respect to the reference signals in computing the processed reference level.

34. A method for reading data from a memory device having data storage units and associated tracking storage units, said method comprising:
(a) substantially concurrently reading data levels from certain data storage units and reference levels from tracking storage units associated with the certain data storage units;
(b) computing a processed reference level from the reference levels;
(c) determining state discrimination levels based on the processed reference level;
(d) discriminating states of the data levels from the certain data storage units based on the state discrimination levels to acquire read data for a requester;
(e) evaluating quality of the reference levels;
(f) determining whether the quality of the reference levels is acceptable;
(g) sending the read data to the requester when said determining (f) determines that the quality of the reference levels is acceptable;
(h) canceling the read data that has been received by the requester when said determining (f) determines that the quality of the reference levels is unacceptable; and
(i) correcting for at least one of the reference levels when said determining (f) determines that the quality of the reference levels is unacceptable.

35. A method for reading data from a memory device having data storage units and associated tracking storage units, said method comprising:
(a) substantially concurrently reading data levels from certain data storage units and reference levels from tracking storage units associated with the certain data storage units;
(b) computing a processed reference level from the reference levels;
(c) determining state discrimination levels based on the processed reference level;
(d) determining read data from the data levels using the state discrimination levels and error correction code processing;
(e) determining whether a data error is indicated by the error code processing; and
(f) evaluating quality of the reference levels and correcting for at least one of the reference levels having poor quality when said determining (e) detects the data error.

36. A method as recited in claim 35, wherein said method comprises:
(g) repeating said computing (b), said determining (c) and said determining (d) following said correcting of at least one of the reference levels.

37. A method for reading data from a memory device having data storage units and associated tracking storage units, said method comprising:
(a) initiating a count;
(b) reading data levels from certain data storage units and reference levels from tracking storage units associated with the certain data storage units;
(c) computing a processed reference level from the reference levels;
(d) determining state discrimination levels based on the processed reference level;
(e) discriminating states of the data levels from the certain data storage units based on the state discrimination levels to acquire read data for a requester;
(f) evaluating quality of the reference levels;
(g) determining whether the quality of the reference levels is acceptable;
(h) comparing the count with a count limit;
(i) correcting for at least one of the reference levels when said determining (g) determines that the quality of the reference levels is unacceptable and said comparing (h) determines that the count does not exceed the count limit;
(j) updating the count;
(k) repeating at least said computing (b) through said comparing (h) one or more times when said determining (g) determines that the quality of the reference levels is unacceptable and said comparing (h) determines that the count does not exceed the count limit; and
(l) directing the read data to the requester when said determining (g) determines that the quality of the reference levels is acceptable or when said comparing (h) determines that the count does exceed the count limit.

38. A memory system, comprising:
a plurality of data storage units, each of the data storage units providing multi-state data storage in a non-volatile manner;
a plurality of tracking storage units, the tracking storage units providing storage for reference levels in a non-volatile manner;
a reference level error manager operatively connected to receive the reference levels from said tracking storage units, said reference level error manager evaluates quality of the reference levels; and a memory controller operatively connected to said data storage units and said tracking storage units, said memory controller operates to control read, write and erase operations with respect to said data storage units and said tracking storage units, said memory controller using state discrimination levels to determine the state of the data storage elements being read.

39. A memory system as recited in claim 38, wherein said memory system further comprises:

state discrimination level circuitry operatively connected to said tracking storage units, said reference level error manager and said memory controller, said state discrimination level circuitry operates to determine the state discrimination levels for use by said memory controller based on a plurality of the reference levels.

40. A memory system as recited in claim 39, wherein said reference level error manager corrects for one or more of the reference levels having an unacceptable quality.

41. A memory system as recited in claim 40, wherein said memory system is a memory card.

42. A memory system as recited in claim 39, wherein at least one of said reference level error manager and state discrimination level circuitry are provided within said memory controller.

43. A memory system as recited in claim 38, wherein said reference level error manager corrects for one or more of the reference levels having an unacceptable quality.

44. A memory system as recited in claim 38, wherein said memory controller causes data to be written to a block of said data storage units, and wherein a set of said tracking storage units associated with the block of said data storage units are written with predetermined reference levels whenever the block of said data storage units are written.

45. A memory system as recited in claim 38, wherein the set of said tracking storage units is read whenever the block of said data storage units is read.

46. A memory system as recited in claim 38, wherein said memory system further comprises:

an error correction unit that assists in determination of the state of the data storage elements being read.

* * * * *